United States Patent
Muench et al.

(10) Patent No.: US 9,154,872 B2
(45) Date of Patent: Oct. 6, 2015

(54) MULTIPLE INPUT AUDIO SWITCH

(71) Applicant: Harman Becker Automotive Systems GmbH, Karlsbad (DE)

(72) Inventors: Tobias Muench, Straubenhardt (DE); Frank Baehren, Pforzheim (DE); Ludwig Guenther, Muggensturm (DE)

(73) Assignee: Harman Becker Automotive Systems GmbH, Karlsbad (DE)

( * ) Notice: Subject to any disclaimer, the term of this patent is extended or adjusted under 35 U.S.C. 154(b) by 250 days.

(21) Appl. No.: 13/951,787

(22) Filed: Jul. 26, 2013

(65) Prior Publication Data

US 2014/0029771 A1 Jan. 30, 2014

(30) Foreign Application Priority Data

Jul. 27, 2012 (EP) ..................................... 12178318

(51) Int. Cl.
*H04R 3/00* (2006.01)
*H04R 5/04* (2006.01)
*H03G 3/34* (2006.01)

(52) U.S. Cl.
CPC ................. *H04R 3/00* (2013.01); *H03G 3/348* (2013.01); *H04R 5/04* (2013.01); *H04R 2420/01* (2013.01)

(58) Field of Classification Search
None
See application file for complete search history.

(56) References Cited

U.S. PATENT DOCUMENTS

| | | | |
|---|---|---|---|
| 2003/0039373 A1* | 2/2003 | Lawson et al. | 381/119 |
| 2006/0153155 A1 | 7/2006 | Jacobsen et al. | |
| 2008/0318518 A1 | 12/2008 | Coutinho et al. | |
| 2010/0104107 A1 | 4/2010 | Shen | |

FOREIGN PATENT DOCUMENTS

WO 2007138778 A1 12/2007

OTHER PUBLICATIONS

European Search Report for corresponding European Application No. 12178318.7, mailed Dec. 4, 2012, 7 pages.

* cited by examiner

*Primary Examiner* — Paul Huber
(74) *Attorney, Agent, or Firm* — Brooks Kushman P.C.

(57) ABSTRACT

A system and method for switching between multiple audio input signals to select one of the audio input signals as audio output signal are disclosed which include receiving the audio input signals, receiving a control signal, and switching controlled by the control signal from a first one of the audio input signals to a second one of the audio input signals. Prior to switching, the first one of the audio input signals is muted and upon switching, the second one of the audio input signals is unmuted in one of multiple unmute modes based on one or more signal parameters characterizing the second one of the audio input signals.

15 Claims, 3 Drawing Sheets

MULTIPLE INPUT AUDIO SWITCH

CROSS-REFERENCE TO RELATED APPLICATIONS

This application claims priority to EP Application No. 12 178 318.7, filed Jul. 27, 2012, the disclosure of which is incorporated in its entirety by reference herein.

TECHNICAL FIELD

Enclosed herein are a system and a method for switching signals between multiple signal sources, and in particular for multiple input audio switching which employs muting and unmuting to perform audio switching without causing audible pops or signal degeneration.

BACKGROUND

Occupants in a car can enjoy audio programs from various types of audio sources such as a CD player, an analog and digital radio tuner, an MP3 player and the like. Conventionally, such an entertainment system is controlled by a head unit that is typically installed in a dashboard and a desired audio source is selected with buttons provided on the head unit. The buttons control audio switches that connect the desired audio source to an amplifier-loudspeaker system. In general, simple audio switches may generate switching spikes, which can cause the known problem of switching noise or "pops", or may cut off parts of the signal. Since highest quality stereo audio is becoming increasingly popular in car audio systems, switching noise and signal degeneration are unacceptable. Therefore, there exists a need for non-obtrusive switching between audio sources.

SUMMARY

A system for switching between multiple audio input signals to select one of the audio input signals as an audio output signal is disclosed. The system includes a switch unit that has audio signal inputs to receive the audio input signals, a control signal input receiving a control signal, an output that is switched to one of the audio signal inputs that depends on the control signal, and a mute unit that is connected downstream of the switch unit output or multiple mute units, each of which being connected upstream of one of the audio inputs. At least one of the mute units is configured to mute, before the switch unit switches from a first audio input signal present at a first one of the audio signal inputs to a second audio input signal present at a second one of the audio signal inputs, and to unmute, upon switching of the switch unit, the second audio input signal into one of multiple unmute modes that depends on one or more signal parameters characterizing the second one of the audio input signals.

Also disclosed is a method for switching between multiple audio input signals to select one of the audio input signals as audio output signal. The method includes receiving the audio input signals, receiving a control signal, and switching, controlled by the control signal, from a first one of the audio input signals to a second one of the audio input signals. Prior to switching, the first one of the audio input signals is muted, and upon switching, the second one of the audio input signals is unmuted into one of multiple unmute modes that depends on one or more signal parameters characterizing the second one of the audio input signals.

BRIEF DESCRIPTION OF THE DRAWINGS

Various specific examples are described in more detail below based on the exemplary systems and methods shown in the figures of the drawings. Unless stated otherwise, similar or identical components are labeled in all of the figures with the same reference numbers.

DETAILED DESCRIPTION

As required, detailed embodiments of the present invention are disclosed herein; however, it is to be understood that the disclosed embodiments are merely exemplary of the invention that may be embodied in various and alternative forms. The figures are not necessarily to scale; some features may be exaggerated or minimized to show details of particular components. Therefore, specific structural and functional details disclosed herein are not to be interpreted as limiting, but merely as a representative basis for teaching one skilled in the art to variously employ the present invention.

Figure 1:
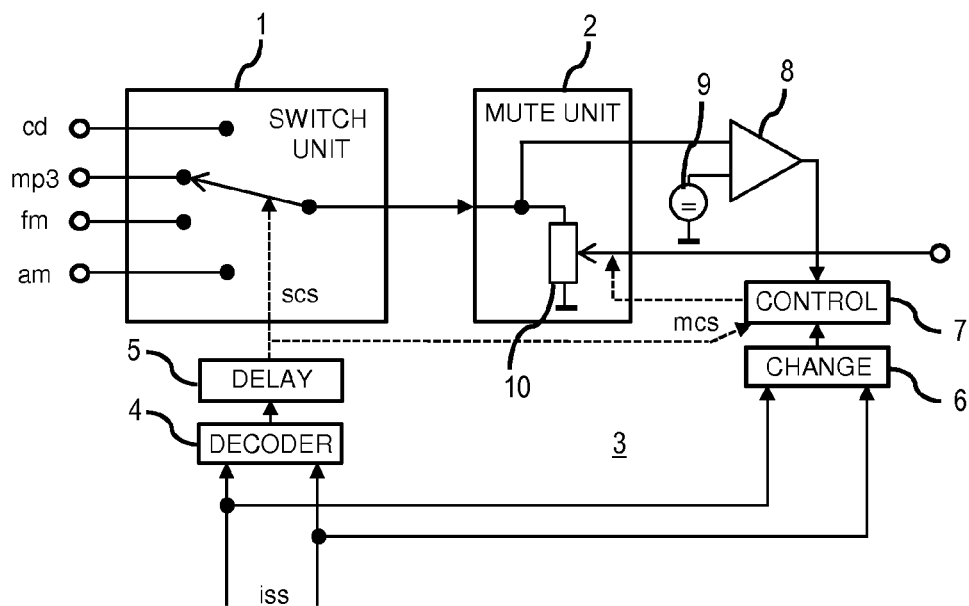
FIG. 1 is a block diagram of an exemplary multiple input audio switch having a single mute unit connected downstream of the switch unit.

Referring to FIG. 1, an exemplary multiple input audio switch may include a controllable switch unit 1 which, controlled by a switch control signal scs, switches one of, for example, four input signals cd, mp3, fm, am through to an output of the switch unit 1, thereby connecting the selected signal (i.e., the signal cd, mp3, fm, am being switched through) to a mute unit 2. The mute unit 2 may be a type of controllable attenuation circuit (not shown) or a controllable potentiometer 10 that, controlled by a mute control signal mcs, attenuates the selected signal according to a given attenuation curve having a fixed or variable shape with a certain slope. The control signals scs and mcs may be generated by control circuitry that may include a decoder 4, a delay 5, a change detector 6, a mute control 7, an analog comparator 8 and a reference voltage source 9.

A two bit input select signal iss for the selection of one of four input signals is supplied to the decoder 4 which generates for each of the four states defined by the two bits a respective signal scs for setting the switch 1 to the one of the four inputs that corresponds to the particular state defined by the two bits of signal iss. The delay 5 delays the signal scs to allow the change detector 6 and the mute control 7 to simultaneously generate the control signal mcs. Alternatively to the configuration shown in which the delay 5 is connected downstream of the decoder 4, the delay 5 may be connected upstream of the decoder 4, thereby delaying the signals iss to the effect that, again, the signal scs is delayed in relation to the input select signal iss.

The (not-delayed) input select signal iss is supplied to the change detector 6 that detects any changes of the state defined by the two bits of input select signal iss, that is when at least one of the two bits of input select signal iss is changed, indicating that a user desires to switch to another input, (i.e., to another signal or program source). Once a state change is detected, the mute control 7 attenuates the signal at its input according to a fixed or variable curve with a given slope depending on the mute control signal mcs. Upon receipt of the switching signal scs indicating that switching is completed or after a given time interval that is sufficient to allow the switching unit 1 to switch to the desired input, the mute unit 2 starts to unmute the current signal at its input, which is different from the signal at its input during muting.

Unmuting is performed in accordance with a fixed or variable unmuting curve having a given slope (and curve shape) that is dependent on the mute control signal mcs. The decision whether a more or less steep slope is used may be made, for instance, by the comparator 8 that evaluates the signal supplied to the mute unit 2, which is the signal after switching and, thus, the signal desired by the user. In the present switch, one criterion for selecting one of the unmute curves (steepnesses) is a parameter, for example, relating to the amplitude of the input signal at the signal input of the mute unit 2. The soft mode is employed when the parameter relating to the amplitude is above a given threshold, otherwise the hard mode is employed. The threshold is provided by the reference voltage source 9 (or any other appropriate arrangement).

Figure 2:
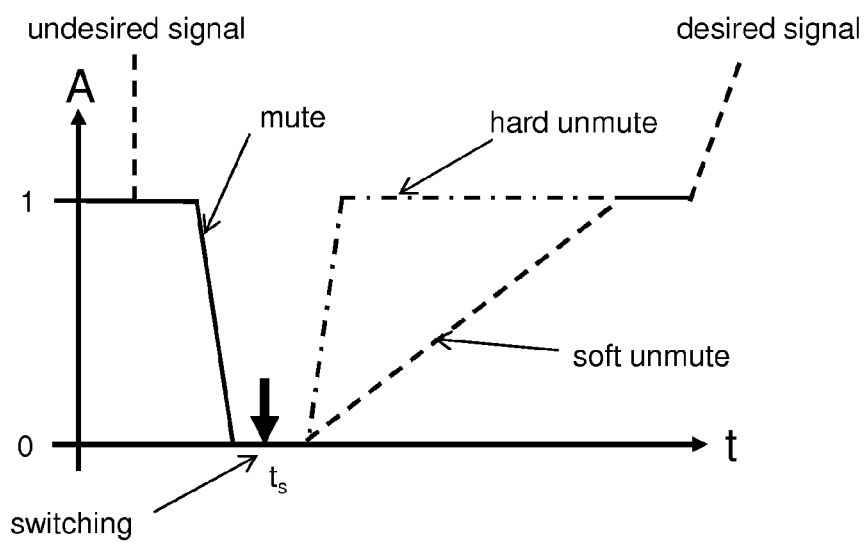
FIG. 2 is a diagram of the signal flow through the switch of FIG. 3 over time and around a point in time.

Reference is now made to FIG. 2, which shows the amplification A overtime t of the mute unit 2 before, at and after a point in time ts at which switching from an undesired signal to a desired signal is performed. First, the undesired signal is not attenuated, (i.e., the amplification A=1). Then, when switching is desired by the user, the undesired signal is gradually muted down to an amplification A=0, at which no signal is transferred from the input to the output of the mute unit 2. In the present example, muting is performed according to a given mute curve with a given steepness. Amplification A reaches zero well before the point in time ts and continues to be zero well after the point in time is to ensure that the switching unit 1 switches only when amplification A is zero. Unmuting of the desired signal is performed after switching from the undesired to the desired signal using one of two alternative linear curves with different steepnesses. Due to the different steepnesses, one curve (steeper curve) provides a hard unmute and the other (flatter curve) a soft unmute.

Figure 3:
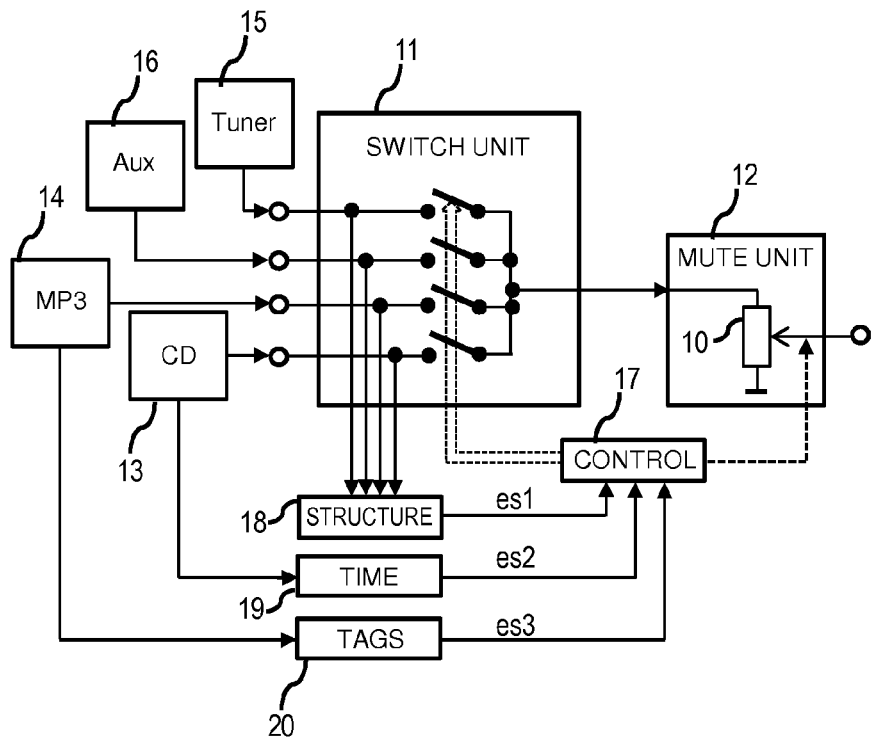
FIG. 3 is a block diagram of another exemplary multiple input audio switch having a single mute unit connected downstream of the switch unit.

FIG. 3 shows an alternative to the audio switch described above with reference to FIG. 1. In the switch of FIG. 3, a switch unit 11 which, controlled by the (e.g., 2-bit) switch control signal scs, connects one of, for example, four input sources (13, 14, 15, 16) (e.g., a CD player 13, an MP3 player 14, a tuner 15 and an auxiliary source 16) to a mute unit 12. In contrast to the switch unit 1 of FIG. 1, in the switch unit 11, four separate switches are employed in which one of the four switches is (always) on, and the other three are off. The switch control signal scs determines which of the switches are controlled on. The mute unit 12 is controlled by the mute control signal mcs and may, for the sake of simplicity, be of the same type as mute unit 2 of FIG. 1. However, the mute unit 12 may any other type of attenuation circuit such as controllable amplifiers, multipliers, switched attenuators, multiplying analog-to-digital converters or the like.

The switch control signal scs and the mute control signal mcs are generated by a control unit 17 that receives evaluation signals es1, es2, es3 from a signal structure evaluation unit 18, a time code evaluation unit 19, and a tag evaluation unit 20, respectively. Some or all signals from the input sources (13, 14, 15, 16) which are supplied to the switch unit 11 are also supplied to the signal structure evaluation unit 18 where they are evaluated in terms of, for example, amplitude-over-time structure to determine whether there is a significant signal or not. If a significant signal is detected, unmuting is performed according to the soft unmute curve, otherwise the hard unmute curve applies. Furthermore, the time code evaluation unit 19 may evaluate the time code (time frame) provided by the CD player 13 such that, if a desired song, music piece, or any other kind of presentation has already started (e.g., time code >0), unmuting is performed according to the soft unmute curve, otherwise the hard unmute curve is used. In a manner similar to the time code, the tags (meta tags, ID-3 tags etc.) provided in connection with, for instance, mp3 files may be evaluated. These tags do not only allow for extracting the time code per se but also for extracting, to a certain extent, the amplitude-over-time structure by evaluating information contained in the tag regarding, for instance, beats-per-minute (bpm), type of music, maximum amplitude etc.

The evaluation signals es1, es2, es3 from the signal structure evaluation unit 18, time code evaluation unit 19, and tag evaluation unit 20 are evaluated by the control unit 17 which decides, based on these signals, which one of the unmute curves available is employed for the unmute. Since in the switch arrangement of FIG. 2 more detailed information is available, more than two different unmute curves may be employed, for example, two hard unmute curves I, II and two soft unmute curves I, II, so that, based on the type of entertainment in general and for music in particular, the amplitude-over-time structure, the beats-per-minute (bpm), the music genre, the maximum amplitude, etc., the control unit 17 distinguishes not only between hard and soft, but also between different types of hard and soft (different steepnesses) and/or different curve shapes (linear, logarithmic, Gaussian etc.) as shown in and discussed below with reference to FIG. 4. In the exemplary switch shown in FIG. 3, the amplitude-over-time structure can be derived not only by the signal structure evaluation unit 18, but also by the time code evaluation unit 19 and the tag evaluation unit 20, so that the signal structure evaluation unit 18 may evaluate, for instance, only signals from the tuner 15 and the auxiliary source 16.

As mentioned above, the control unit 17 of FIG. 3 also controls the switch unit 11 so that the point in time ts may be also controlled in a certain time range after receiving a user instruction to switch sources that depends on, for example, the kind of presentation in general and for music in particular, the amplitude-over-time structure, the beats-per-minute (bpm), the type of music, the maximum amplitude, the music genre, maximum amplitude of both, the desired and the undesired signal, in order to find the most appropriate point in time ts in this particular time range for fading the two signals.

Figure 4:
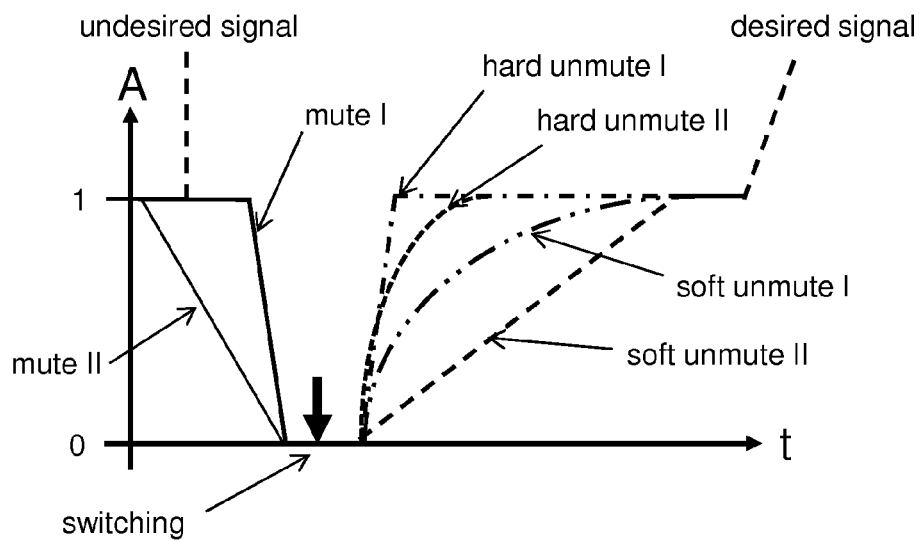
FIG. 4 is a diagram of the signal flow through the switch of FIG. 3 over time and around a point in time.

In FIG. 4, an example of the signal flow over time around point in time ts in the switch of FIG. 3 is shown as amplification A overtime t of the mute unit 12 before, at and after a point in time ts at which switching from an undesired signal to a desired signal is performed. First the undesired signal is not attenuated (i.e., the amplification A=1). Then, when switching is desired by the user, the undesired signal is gradually muted down to an amplification A=0 (according to one of two optional mute curves I and II with different steepnesses). Amplification A reaches zero in sufficient time before a point in time ts and continues to be zero for a sufficient time after the point in time ts in order to ensure that the switching unit 1 switches only when amplification A is zero. Unmuting of the desired signal is performed after switching from the undesired to the desired signal using one of two alternative linear curves with different steepnesses. Due to the different steepnesses, one curve (steeper curve) provides a hard unmute and the other (less steep curve) a soft unmute. The selection of the appropriate mute curve may be made in any possible way, in particular in a manner similar to the unmuting process.

Figure 5:
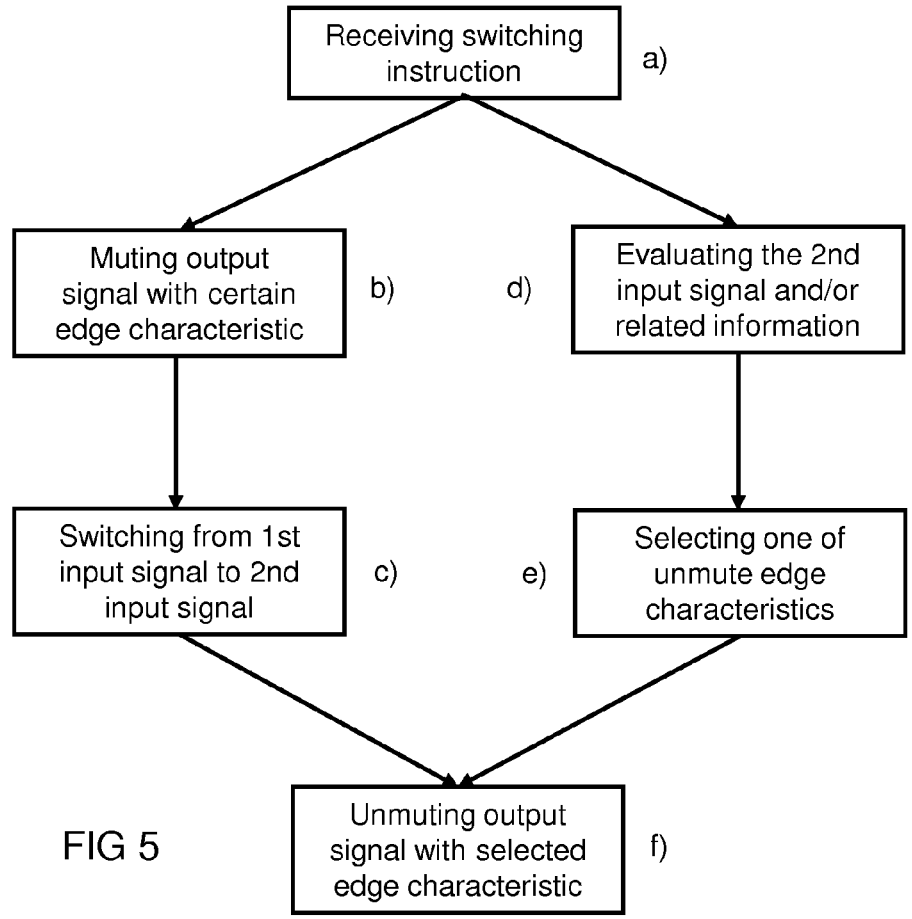
FIG. 5 is a process chart illustrating an exemplary process sequence for switching between multiple input sources.

FIG. 5 is a process chart illustrating an exemplary process sequence for switching between multiple, for example, two input sources. Upon receiving a switching instruction (in a process section a) the output signal of the switching unit, which is at this point of time the undesired signal (e.g., first signal), is muted with a certain edge characteristic (in a process section b) and subsequently, when the output signal is totally muted, switching from the undesired to the desired signal (e.g., second signal) is performed (in a process section c). Finally, the desired signal which forms now the output signal of the switching unit is unmuted according to a dedicated edge characteristic (in a process section f). The edge characteristic is selected prior to process section f) in a process section e) based on information provided in a process section d) in which the desired signal itself and/or information related thereto is evaluated in terms of timely structure, dynamics, amplitude etc. As shown, process sections b) and c) may form a first process path and process sections d) and e) may form a second process path, whereby first and second path are operated in parallel between process sections a) and f). Alternatively (not shown), process sections b)-e) may be serially arranged in any order between process sections a) and f), e.g., a--b-c-d, a-c-b-d, c-d-a-b, c-a-b-d.

Figure 6:
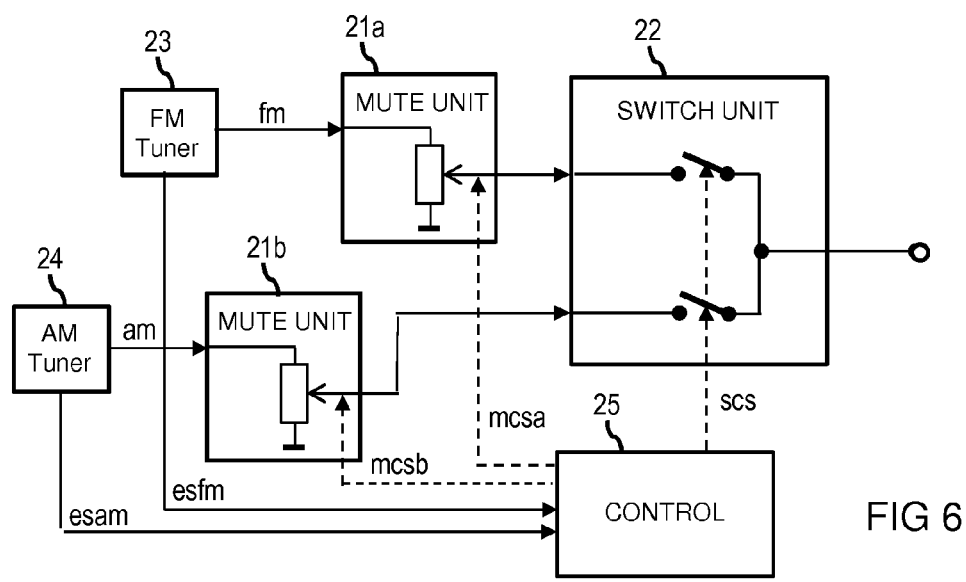
FIG. 6 is a block diagram of an exemplary multiple input audio switch having multiple mute units connected upstream of the switch unit.

Referring to FIG. 6, the system shown includes two mute units 21a and 21b which are connected upstream of a switch unit 22. Outputs of the mute units 21a, 21b are connected to inputs of the switch unit 22, which provides the system output signal. The mute units 21a, 21b are supplied with audio signals fm, am from two audio sources (e.g., an FM Tuner 23 and an AM Tuner 24). The FM Tuner 23 and the AM Tuner 24 supply to a control unit 25 evaluation signals esfm, esam that represent signal parameters characterizing the audio input signals fm, am, such as, for instance, amplitude-over-time structure, type of audio content (e.g., music or speech), type of music (beats-per-minute, genre etc.). The control unit 25 generates control signals mcsa, mcsb and scs with which the mute units 21a, 21b and the switch unit 22 are controlled. Controlled by the control unit 25, the switch unit 22 switches from a first one (e.g., fm or am) of the audio input signals fm, am to a second one (e.g., am or fm) of the audio input signals fm, am. Prior to switching, (at least) the first one of the audio input signals is muted and upon switching, (at least) the second one of the audio input signals is unmuted into one of multiple unmute modes that depend on one or more signal parameters characterizing (at least) the second one of the audio input signals, for example, one of evaluation signals esfm or esam.

The systems disclosed herein, in particular their signal processing units such as filters, adders, subtractors, weighting elements etc., may be realized in dedicated (analog and/or digital) hardware and/or in programmable (digital) hardware such as microprocessors, signal processors, microcontrollers or the like, with adequate software-based control. Such a software, i.e., its instructions, may be stored in an adequate memory (or any other computer-readable medium) and be read out to enable the microprocessor hardware or at least parts thereof to perform the function (method) of certain processing units (e.g., filter, adder, subtractor, weighting element) per se and in combination with other units. Although only switching systems that process monaural audio signals are shown above, it is clear that also stereophonic and other multi-channel signals can be processed by using an adequate number of mute and switching units per channel.

It will be obvious to those reasonably skilled in the art that other components performing the same functions may be suitably substituted. Such modifications to the concept disclosed herein are intended to be covered by the appended claims.

While exemplary embodiments are described above, it is not intended that these embodiments describe all possible forms of the invention. Rather, the words used in the specification are words of description rather than limitation, and it is understood that various changes may be made without departing from the spirit and scope of the invention. Additionally, the features of various implementing embodiments may be combined to form further embodiments of the invention.

What is claimed is:

1. A system for switching between multiple audio input signals to select one of the audio input signals as an audio output signal; the system comprises:
    a switch unit that has audio signal inputs to receive the audio input signals, a control signal input to receive a control signal, and an output that is switched to one of the audio signal inputs based on the control signal; and
    a mute unit that is connected downstream of the output of the switch unit or multiple mute units, each of which being connected upstream of one of the audio signal inputs; in which
    at least one of the mute units is configured to mute, before the switch unit switches from a first audio input signal present at a first one of the audio signal inputs to a second audio input signal present at a second one of the audio signal inputs, and to unmute, upon switching of the switch unit, the second audio input signal into one of multiple unmute modes based on one or more signal parameters characterizing the second one of the audio input signals, wherein a particular unmute mode is selected whether there is a significant signal or not.

2. The system of claim 1, in which the unmute modes include a hard mode and a soft mode and in which in the hard mode umutes at a steeper slope than in the soft mode.

3. The system of claim 2, in which the one or more signal parameters relates to an amplitude of an audio input signal at the second audio signal input, and the soft mode is employed when the one or more signal parameters relating to the amplitude is above a first threshold, and otherwise the hard mode is employed.

4. The system of claim 2, in which an audio input signal at a second audio signal input exhibits a structured time frame, the one or more signal parameters relates to the time frame, and the soft mode is employed when the one or more signal parameters relating to the time frame exceeds a second threshold, and otherwise the hard mode is employed.

5. The system of claim 3, in which the mute unit is configured to receive and evaluate data characterizing the audio input signal at the second audio signal input and to select one of the multiple unmute modes according to the data.

6. A method for switching between multiple audio input signals to select one of the audio input signals as an audio output signal; the method comprises:
    receiving the audio input signals, receiving a control signal and switching controlled by the control signal from a first one of the audio input signals to a second one of the audio input signals; in which
    prior to switching, the first one of the audio input signals is muted and upon switching, the second one of the audio input signals is unmuted in one of multiple unmute modes based on one or more signal parameters characterizing the second one of the audio input signals, wherein a particular unmute mode is selected whether there is a significant signal or not.

7. The method of claim 6, in which the unmute modes include a hard mode and a soft mode and in which the hard mode unmutes at a steeper slope than in the soft mode.

8. The method of claim 7, in which the one or more signal parameters relates to an amplitude of an audio input signal at a second audio signal input, and in which the soft mode is employed when the one or more signal parameters relating to the amplitude is above a first threshold, otherwise the hard mode is employed.

9. The method of claim 7, in which an audio input signal at a second audio signal input exhibits a structured time frame, the one or more signal parameters relates to the time frame, and the soft mode is employed when the one or more signal parameters relating to the time frame exceeds a second threshold, otherwise the hard mode is employed.

10. The method of claim 8, further comprising receiving and evaluating data that characterize the audio input signal at the second audio signal input and to select one of the multiple unmute modes based on the data.

11. A system for switching between multiple audio input signals to select one of the audio input signals as an audio output signal; the system comprising:
   a switch unit including:
      a plurality audio signal inputs to receive the audio input signals,
      a control signal input to receive a control signal, and
      an output for being switched to one of the audio signal inputs based on the control signal; and
   a mute unit connected downstream of the output or multiple mute units, each of which being connected upstream of one of the plurality of audio signal inputs; in which
   at least one of the mute units is configured to mute, before the switch unit switches from a first audio input signal present at a first one of the plurality of audio signal inputs to a second audio input signal present at a second one of the plurality of audio signal inputs, and to unmute, upon switching of the switch unit, the second audio input signal into one of a plurality of unmute modes based on at least one signal parameter that defines the second audio input signal, wherein a particular unmute mode is selected whether there is a significant signal or not.

12. The system of claim 11, in which the unmute modes include a hard mode and a soft mode and in which in the hard mode umutes at a steeper slope than in the soft mode.

13. The system of claim 12, in which the at least one signal parameter relates to an amplitude of an audio input signal at a second audio signal input of the plurality of audio signal inputs, and the soft mode is employed when the at least one signal parameter related to the amplitude is above a first threshold, otherwise the hard mode is employed.

14. The system of claim 12, in which an audio input signal at a second audio signal input of the plurality of audio signal inputs exhibits a structured time frame,
   the at least one signal parameter corresponding to the time frame, and the soft mode is employed when the at least one signal parameter corresponding to the time frame exceeds a second threshold, otherwise the hard mode is employed.

15. The system of claim 13, in which the mute unit is configured to receive and evaluate data defining the audio input signal at the second audio signal input and to select one of the multiple unmute modes based on the data.

\* \* \* \* \*